United States Patent [19]
Rosvold

[11] 3,938,243
[45] Feb. 17, 1976

[54] SCHOTTKY BARRIER DIODE SEMICONDUCTOR STRUCTURE AND METHOD

[75] Inventor: Warren C. Rosvold, Sunnyvale, Calif.

[73] Assignee: Signetics Corporation, Sunnyvale, Calif.

[22] Filed: May 17, 1974

[21] Appl. No.: 470,939

Related U.S. Application Data

[60] Division of Ser. No. 334,022, Feb. 20, 1973, Pat. No. 3,855,612, which is a continuation-in-part of Ser. No. 214,590, Jan. 3, 1972, abandoned.

[52] U.S. Cl. .................. 29/578; 29/589; 357/15; 427/84
[51] Int. Cl.² ........................................ B01J 17/00
[58] Field of Search...... 29/578, 589, 576 O, 576 C; 357/15; 117/217, 227

[56] References Cited
UNITED STATES PATENTS

| | | | |
|---|---|---|---|
| 3,590,471 | 7/1971 | Lepselter | 29/578 |
| 3,609,472 | 9/1971 | Bailey | 29/589 |
| 3,616,380 | 10/1971 | Lepselter | 357/15 |
| 3,623,925 | 11/1971 | Jenkins | 357/15 |
| 3,699,408 | 10/1972 | Shinoda | 357/15 |

Primary Examiner—W. Tupman
Attorney, Agent, or Firm—Flehr, Hohbach, Test, Albritton & Herbert

[57] ABSTRACT

Schottky barrier diode semiconductor structure having a semiconductor body formed essentially of silicon and having a surface with an active device formed in the semiconductor body having collector, base and emitter regions and with at least two metals on said surface combining with the silicon to form an alloy of at least two metals and silicon which is in contact with the collector, base and emitter regions and also extends beyond the base region to form a Schottky barrier diode having a barrier height which is determined by the composition of the alloy.

In the method, the alloy of at least the two metals in combination with the silicon is adjusted to modify the barrier height of the Schottky barrier diode so that a barrier height can be chosen ranging from between 0.64 and 0.835.

6 Claims, 10 Drawing Figures

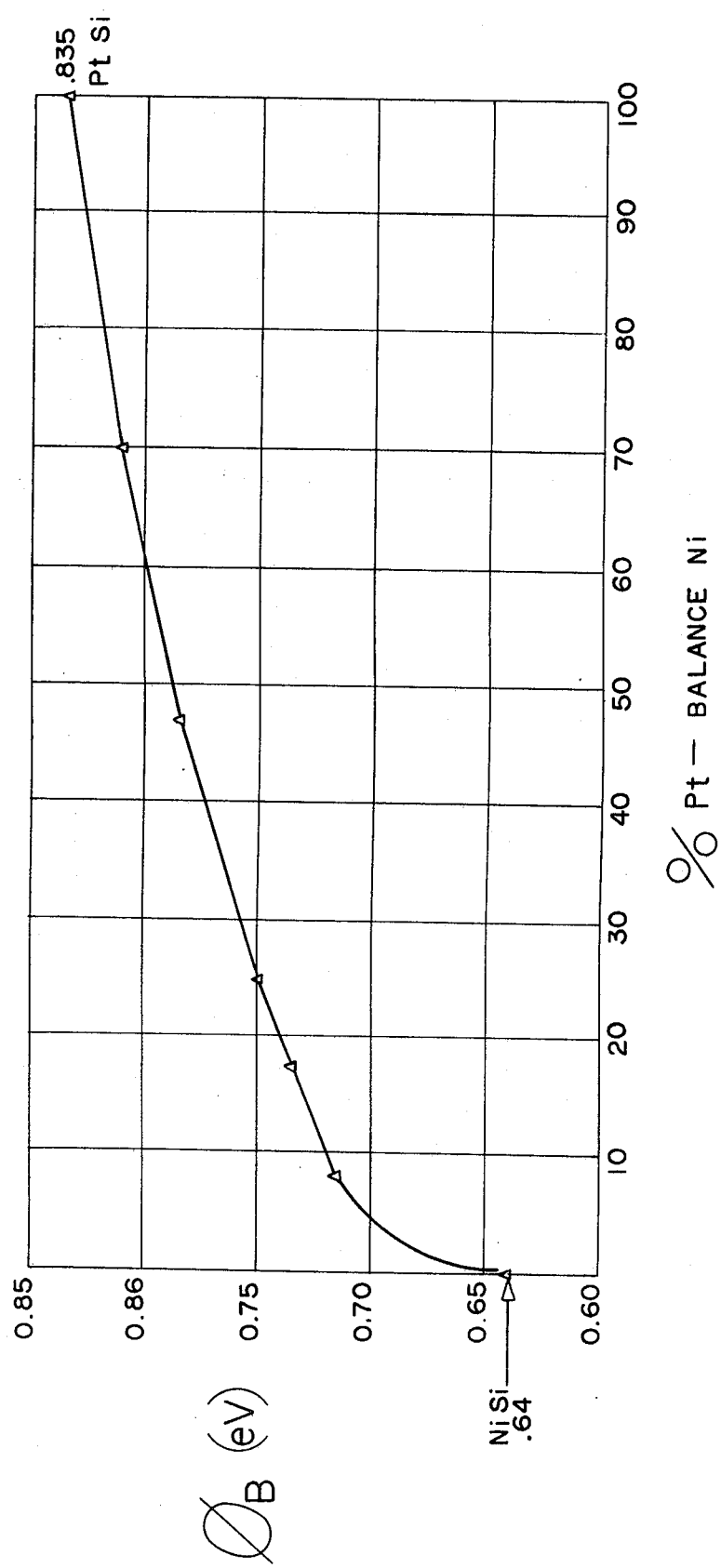

SCHOTTKY BARRIER DIODE SEMICONDUCTOR STRUCTURE AND METHOD

CROSS-REFERENCE TO RELATED APPLICATION

This application is a division of Ser. No. 334,022, now U.S. Pat. No. 3,855,612, which is a continuation-in-part of application Ser. No. 214,590, filed Jan. 3, 1972, now abandoned.

BACKGROUND OF THE INVENTION

1. Field of Invention

This invention relates to the formation of Schottky barrier diodes and in particular the formation of such Schottky barrier diodes by the use of a platinel silicide.

2. Description of Prior Art

In integrated circuits used for certain applications as, for example, primarily logic circuit applications, Schottky barrier diodes are used in conjunction with the base-collector junction in order to keep the transistor from going deeply into saturation during operation. Previously this has been accomplished by using gold diffusion and other approaches to decrease the carrier lifetime. Such Schottky barrier diodes improve the recovery time of a device and thus improve the speed of the integrated circuit. Schottky barrier diodes have been formed using an aluminum silicide. However, because of the Schottky barrier height, it has been difficult to provide a plurality of such devices which can be placed in operation all at the same time as, for example, in a large integrated circuit. There is, therefore, a need for a new and improved Schottky barrier diode.

SUMMARY OF THE INVENTION AND OBJECTS

The semiconductor structure consists of a semiconductor body formed essentially of silicon and having a planar surface. An alloy of platinel silicide is formed on said surface on predetermined areas thereof. A layer of insulating material is disposed on the surface and contact means carried by said layer of insulating material extends through said surface and makes contact with said alloy of platinel silicide in said predetermined areas.

In the method for fabricating the semiconductor structure, a semiconductor body is provided which is formed essentially of silicon which has a planar surface. A layer of insulating material is formed on the surface and openings are formed in the layer of insulating material extending to said surface. A mixture of platinum and nickel is deposited into the openings. The semiconductor body is heated to form an alloy between the silicon and the platinum and nickel to form a ternary compound. The unreacted platinum and nickel in the field is removed. Contacts are formed which are carried by the layer of insulating material and which extend through the openings in the layer of insulating material to make contact with said ternary compound in said predetermined areas.

In general, it is an object of the present invention to provide a structure and method which provides a Schottky barrier diode.

Another object of the invention is to provide a structure and method of the above character which has a low Schottky barrier height and also a low contact resistance.

Another object of the invention is to provide a structure and method in which it is possible to obtain substantially the same barrier height as with an aluminum system.

Another object of the invention is to provide a structure and method of the above character in which it is possible to adjust the barrier height between a predetermined range of 0.64 and 0.835.

Another object of the invention is to provide a structure and method of the above character which makes it possible to tailor the barrier height to the circuit design.

Another object of the invention is to provide a structure and method of the above character in which at least two metals are utilized in combination with silicon to form a ternary compound.

Another object of the invention is to provide a structure and method of the above character in which a ternary compound is formed.

Another object of the invention is to provide a structure and method of the above character in which the ternary compound is metallurgically compatible with both aluminum and gold interconnection systems.

Another object of the invention is to provide a structure and method of the above character in which the ternary compound is formed without going into a liquid phase.

Another object of the invention is to provide a structure and method of the above character in which the ternary compound is formed at a temperature of approximately 350°C.

Another object of the invention is to provide a structure and method of the above character in which the Schottky diode has an optimum barrier height value with an optimum size.

Another object of the invention is to provide a structure and method of the above character in which the Schottky barrier diode can be utilized with a transistor to provide a Baker clamped transistor.

Additional objects and features of the invention will appear from the following description in which the preferred embodiment is set forth in detail in conjunction with the accompanying drawing.

BRIEF DESCRIPTION OF THE DRAWING

FIG. 10 is a graph showing Schottky barrier height as a function of platinum concentration in platinel silicide.

DESCRIPTION OF PREFERRED EMBODIMENT

Figure 1:
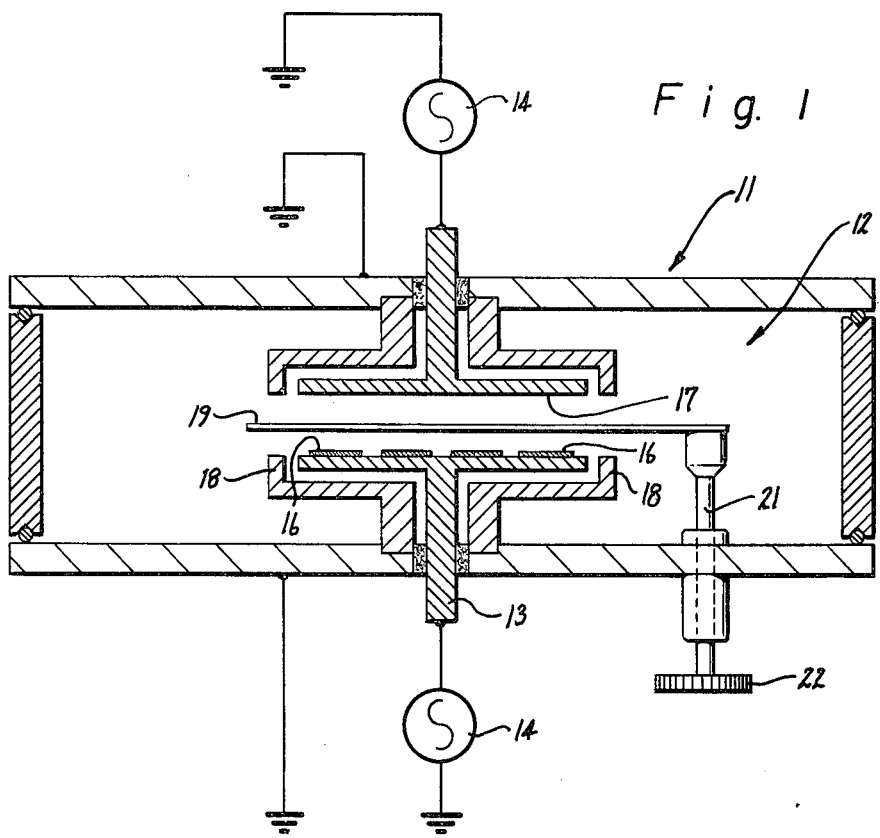
FIG. 1 is a cross-sectional view of an RF sputtering system used in conjunction with the present method for fabricating a structure of the present invention.

In FIG. 1 there is shown a bi-directional RF sputtering system which can be utilized for evaporating or sputtering the materials which are utilized in conjunction with the present invention. Thus, as shown in FIG. 1, a housing 11 is provided with a chamber 12 adapted to be evacuated to provide the desired vacuum within the chamber. A substrate holder 13 is rotatably mounted in the chamber 12 and, if desired, is adapted to be rotated by means (not shown). RF power is supplied to the substrate holder 13 from a source 14 in the form of an RF power oscillator oscillating at a suitable frequency such as 13.56 mHz. The substrate holder 13 is adapted to carry a plurality of substrates 16 positioned on the upper surface of the substrate holder and facing a target 17 mounted within the chamber 12. The target 17 is connected to the other side of the RF power supply 14. A pair of dark shields 18 are provided in the chamber and serve a function well known to those skilled in the art. A shutter 19 is rotatably mounted upon a spindle 21 which has a hand wheel 22 provided thereon so that the shutter 19 can be moved between two positions, one in which it is out of the way so that the target is exposed to the substrate holder, and another position in which the shutter 19 is disposed between the target 17 and the substrate holder 13.

Figure 2:
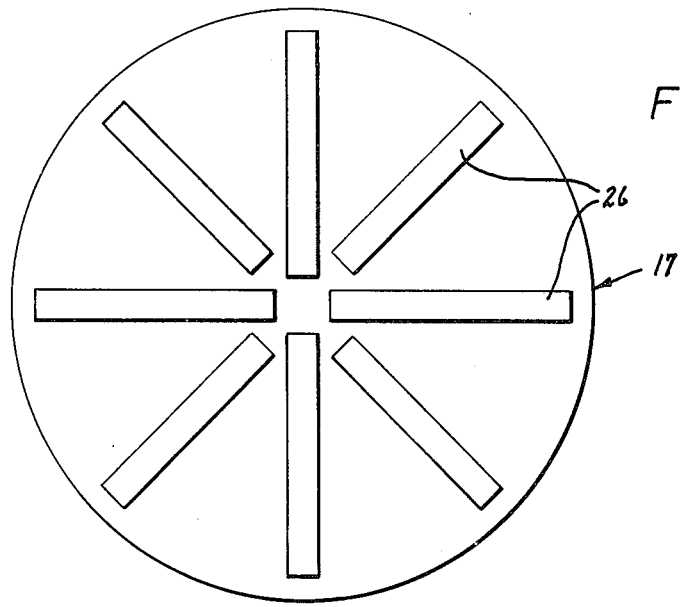
FIG. 2 is a plan view showing the way in which a target is formed for use in the apparatus shown in FIG. 1.

A plan view of the target 17 is shown in FIG. 2. The target is formed of the materials which it is desired to evaporate to form the ternary compound utilized in connection with the present invention. Thus, the target 17 can be formed of two of the materials of the compound such as bulk nickel having an impurity of 99.9% with strips 26 of platinum formed thereon having an impurity of 99.99%. As hereinafter explained, the area covered by the platinum strips is precisely chosen so that there is a predetermined ratio between the exposed area of the nickel and the exposed area of the platinum.

Figure 3:
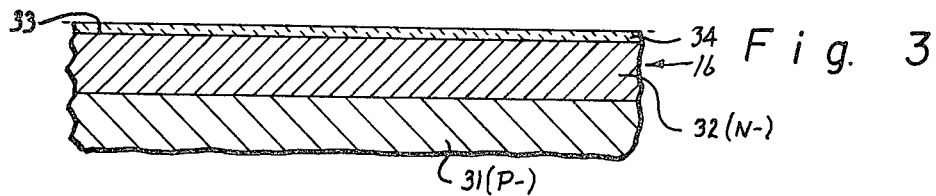
FIGS. 3–8 are cross-sectional views of a semiconductor structure showing the steps utilized for fabricating a semi-conductor structure of the present invention.

The substrate 16 upon which the two materials are to be evaporated or sputtered in the apparatus shown in FIG. 1 can be of any suitable type. However, in connection with the present invention, it is desirable that the semiconductor structure be formed of a semiconductor body 31 formed essentially of silicon. A buried layer (not shown) can be provided if desired. As shown in FIG. 3, this semiconductor body can be provided with a suitable impurity such as a P-type impurity. An epitaxial layer 32 is formed on the body 31 and also has a certain impurity therein such as an N-type impurity. The epitaxial layer 32 is provided with a planar upper surface 33 which is covered by a layer of suitable insulating material such as silicon dioxide.

Figure 4:
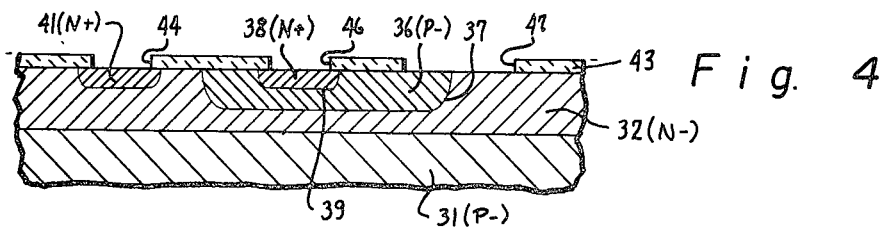
Figure 5:
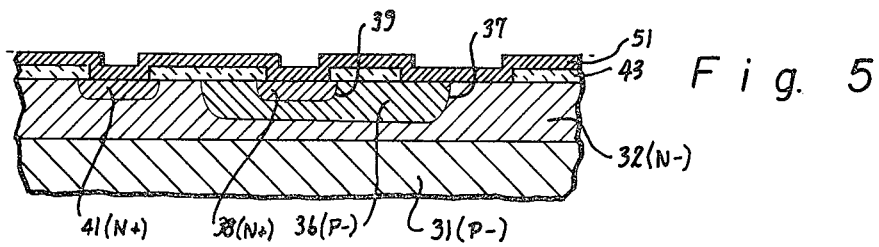

Thereafter, by conventional techniques well known to those skilled in the art, the desired active and passive devices are formed in the epitaxial layer 32. Thus, as shown in FIG. 4, there can be provided an active device in the form of a transistor by forming a P-type region 36 in the layer 32 which is defined by a dish-shaped P-N junction 37 extending to the surface. Similarly, there is provided an N-type region 38 which has been diffused into the P-type region 36 and is defined by a dish-shaped P-N junction 39 also extending to the surface 33. At the same time, an N+ region 41 is formed in the layer 22 to make contact to the collector region of the active device.

After the necessary diffusions have been carried out, the oxide layer 34 is preferably stripped and a new oxide layer 43 is grown on the surface 33 and by the use of conventional photolithographic techniques, openings 44, 46 and 47 are formed in the insulating layer 43 to expose predetermined areas of the surface. Thus, it can be seen that the openings 44 expose the collector contact regions 41; the openings 46 expose the emitter regions 38; and the openings 47 expose the base regions 39 and also are used for making the Schottky diodes as hereinafter described.

After the openings 44, 46 and 47 have been formed, the semiconductor structure which is shown in FIG. 3 is cleaned in the apparatus shown in FIG. 1 utilizing RF induced argon ion bombardment at 0.55 watts per sq. cm. for a period of approximately 3 minutes. During this time approximately 150 Angstroms of silicon are removed while only approximately 60 Angstroms of silicon dioxide from the layer 43 are removed. This cleaning operation is carried out to ensure that there is no possible contamination on the surface of the silicon in the openings 44, 46 and 47.

As soon as the cleaning operation has been completed, the shutter 19 is moved into a position between the substrate holder and the target to protect the substrate 16 from the initial sputtering from the target.

The semiconductor structures of the type shown in FIG. 4 are positioned on the substrate holder 13 as shown in FIG. 1 with the openings 44, 46 and 47 facing the target.

After the shutter 19 has been moved into position between the substrate holder and the target, the target is cleaned to remove any oxidized or chemically contaminated portions of the target itself. The target itself is cleaned at a power density of 1.5 watts per sq. cm. for approximately 5 minutes. Approximately 1500 Angstroms of material is removed from the target during this operation.

As soon as the cleaning operation has been completed, the shutter 19 is moved to an out-of-the-way position and material is deposited from the target over the entire surface of each of the substrates carried by the substrate holder to form a layer 51 on each of the substrates which overlies the surface of the same layer 43 and also extends into the openings 44, 46 and 47 to make contact with predetermined areas of the surface 33. The layer 51 can have a thickness ranging from 500 to 1000 Angstroms. However, a thickness of approximately 750 Angstroms is preferable to satisfy the chemical reaction hereinafter described.

As explained previously, the target 17 is formed of two materials so that an alloy of the two materials is formed having a predetermined proportion of the two materials. It has been found that in connection with the present invention it is desirable to provide an alloy of nickel and platinum in which the alloy is from approximately 75% to 90% nickel with the remainder being platinum. The preferred percentage has been found to be approximately 88% nickel and 12% platinum. To obtain the desired ratios, platinum strips 26 are resistance welded to the nickel target so that the platinum strips 26 represent approximately 12% of the area and the remainder of the target which is formed of nickel represents approximately 88% of the area. Since both materials have almost identical deposition rates when bombarded with RF activated ions of argon, the alloy which is formed of platinum and nickel and called platinel has the same ratio as the ratios of the areas which are exposed to the RF activated ions.

After the RF sputtering operation has been completed, the substrates are removed from the RF sputtering apparatus shown in FIG. 1 and are placed in a vacuum alloy furnace which is then pumped down to a vacuum which is less than $5 \times 10^{-6}$ Torr. The substrate is then heated to a temperature which is 350°C and above to possibly as high as 900°C with the preferable temperature being approximately 450°C. When a temperature of 450°C is utilized, the temperature is maintained for approximately 2 minutes. A solid-solid reaction takes place when all the available platinel is consumed or, in other words, reacts with the silicon in the windows or openings 44, 46 and 47 to form a ternary compound which can be identified as a platinel silicide alloy. In this reaction, it is important that the reaction not pass through a liquid phase but that it all take place in the solid phase. In connection with this alloying operation, it is desirable to keep the temperature as low as possible because this has the least effect upon the active and passive devices which may be formed in the substrate and also because it simplifies cooling of the substrates.

Although it has been stated that the alloying operation should be carried out in a separate alloying furnace, it should be appreciated that if desired, the alloying operation can also be carried out in the RF sputtering apparatus shown in FIG. 1 even though greater difficulty may be encountered in cooling the substrates after the alloying operation has been completed.

Figure 6:
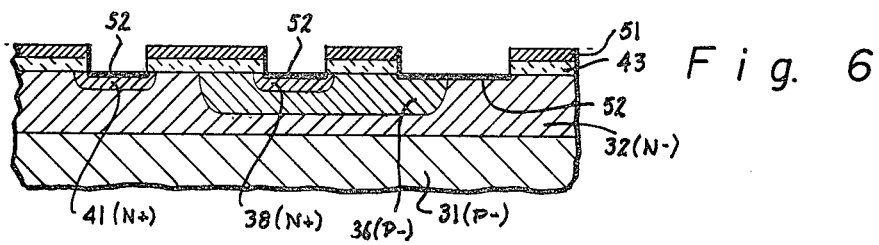

The platinel combines with the silicon to form the ternary alloy regions 52 as shown in FIG. 6. It has been found that this reaction is almost instantaneous and for this reason only a very small amount of time is required for the reaction at a very low temperature. It is believed that this is possible because there is involved a solid-solid interfacial reaction between metals representing atomically clean surfaces or, in other words, in which the interfaces are not contaminated.

During the alloying operation, it is found that the alloy of nickel and platinum or, in other words, the platinel combines with approximately equal amounts of silicon so that the ternary alloy has a composition which is approximately 50% silicon and 27½ to 45% nickel, with the balance being platinum. Thus, when the platinel is formed of 88% nickel and 12% platinum, the ternary alloy will have 50% silicon, 44% nickel and 6% platinum. It also has been found that the depth to which the ternary alloy is formed is determined by the depth of the original layer 51. Thus, if the layer 51 is deposited to a depth of 1000 Angstroms, the silicon will be reacted with the platinel to a depth of approximately 1000 Angstroms.

After the ternary alloy 52 has been formed, the platinel is removed from the field or, in other words, in any area in which the platinel was not in direct contact with silicon. This is accomplished by the use of a suitable material such as sulphuric acid consisting of three volumes of $H_2O_2$ with 7 volumes of $H_2SO_4$. The platinel silicide is inert to this solution and is not affected by it.

Figure 7:
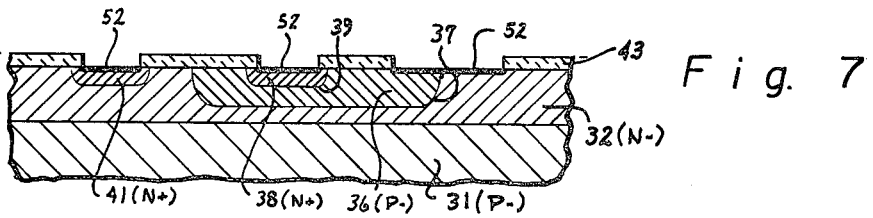
Figure 8:
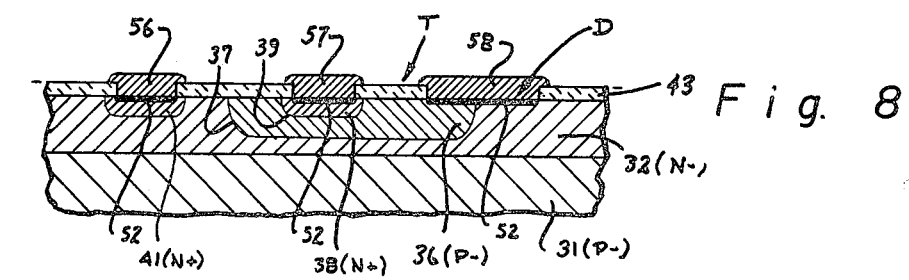

After the undesired platinel has been removed as shown in FIG. 7, a suitable metal such as gold or aluminum is evaporated over the insulating layer 43 and into the openings 44, 46 and 47. Thereafter, the undesired portions of the metal are removed by suitable photolithographic techniques so that there remains contact means in the form of leads 56, 57 and 58 which extend into the windows or openings 44, 46 and 47 and make contact with the ternary alloy regions 52 overlying the collector contact, emitter contact and base contact areas as shown in FIG. 8. As will also be noted from FIG. 8, the platinel silicide region 52 contacting the base region 39 also extends to the right of the base region and makes contact with the epitaxial layer 32 and thus effectively shorts the base to the collector of the active device as shown in FIG. 8 which can be identified as a transistor T through what can be termed the Schottky barrier diode D. The Schottky barrier diode is formed by the portion of the alloy 52 to the right of the base region 36. The Schottky barrier diode operates in a manner well known to those skilled in the art to continuously bleed off the majority carriers which are electrons so that the collector is not permitted to saturate.

Figure 9:
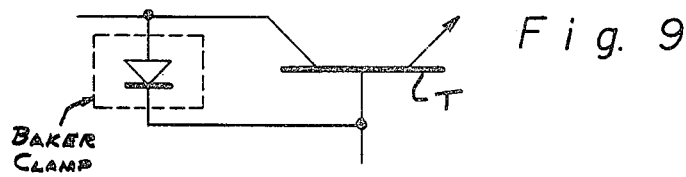
FIG. 9 is a circuit diagram showing the manner in which the Schottky barrier diode formed in FIG. 8 serves to provide a "Baker-clamped" transistor.

A schematic representation of the effect of the Schottky barrier diode is shown in FIG. 9 in which the Schottky barrier diode serves to provide a Baker-clamped transistor which will not operate far into saturation thereby enhancing circuit speeds and noise characteristics for the device.

It has been found that the use of the platinel silicide is very desirable in the present semiconductor structure because an optimum barrier height value ranging from between 0.68 to 0.75 and preferably 0.7 electron volts is provided. At the same time that this optimum barrier height value is being obtained, it is possible to optimize the size of the Schottky barrier diode so that it can be relatively small while still having the desired thermal stability.

By way of example, the present invention was used to replace the all-aluminum metallurgy previously incorporated in the Signetics 7400S series of integrated circuits. This device used Baker-clamped transistors and thus avoids the problems of gold diffusion. It has been found that improved yields can be obtained using the platinel silicide. Typical parameters of platinel silicide Schottky barrier diode transistors are as follows:

Internal Overlay Schottky Barrier Transistor

Beta at 100 $\mu A$ is 80
Voltage offset at 1 $\mu A$ is 335 mV
Voltage, base to collector at 1 $\mu A$ is 350 mV Output Guard Ring Schottky Barrier Transistor Voltage Offset at 1 $\mu A$ is 300 mV
Voltage, base to collector at 1 $\mu A$ is 320 mV A Schottky barrier height of 0.70 electron volts is consistent with integrated circuit design rules for Baker-clamped transistors using Schottky barrier diodes. In addition, the contact resistance of the platinel silicide to P-type silicon having an impurity concentration of $10^{19}$ at $cm^{-3}$ is low. These physical qualities make the platinel silicide superior to the non-alloy silicides for circuit applications as can be seen from the table set forth below:

| Metal Silicide | $Rc^{IN}$ $10^{19}$ at $cm^{-3}$ SiP | DB IN $10^{17}$ at $cm^{-3}$ $Si_n$ <100> |
| --- | --- | --- |
| Platinel | $10^{-2}$ $\Omega$ | 0.70 $pV$ |
| Platinum | $10^{-2}$ $\Omega$ | 0.80 $pV$ |
| Nickel | 10 $\Omega$ | .67 $pV$ |
| Aluminum | $5 \times 10^{-3}$ $\Omega$ | .73 $pV$ |
| Rhodium | 1 $\Omega$ | 0.70 $pV$ |

As can be seen from the table, platinum forms an unusually excellent ohmic contact to silicon. However, its Schottky barrier height when formed as platinum silicide, is unusually high, being approximately 0.835 electron volts in less than $10^{18}$ atoms per $cm^3$ in N-type silicon. Nickel, on the other hand, when reacted with silicon has quite a low Schottky barrier height, approximately .64 electron volts in the N-type silicon but its contact resistance to other doped silicon, particularly P-type, is very, very high. Platinel, when combined with silicon to provide the platinel silicide, provides the desired low contact resistance and the optimum Schottky barrier height.

In the embodiment of the invention shown in FIG. 8, the low contact resistance to P-type silicon is particularly significant with respect to the base which is doped with a P-type impurity. It also would be particularly important for diffused resistors (not shown) which also would be doped with P-type impurities. It can be readily appreciated that if the contact resistance was high, the $V_{be}$ saturation levels of the transistor would be too high for normal device operation and, in addition, the values of the resistors would be changed so that the device would not operate as intended and possibly would not operate at all. Thus, the use of the platinel silicide provides the desired low contact resistance while at the same time providing a Schottky barrier height within certain limits to provide normal clamping operations.

The platinel silicide produced by the present invention should be suitable for use in practically all integrated circuits and even in discrete devices. In addition, it also could be used as a replacement for the platinum silicide in the classical beam lead metallurgy structure giving the advantage that it does have a low Schottky barrier height which can be used in circuitry where this is of importance.

The platinel silicide does not differ intrinisically in electrical aspects from aluminum but is advantageous principally because it is easy to fabricate semiconductor structures using the same while obtaining a very high yield even where there are large numbers of junctions in the device. One of the principal reasons it is possible to obtain a higher yield is that it is much easier to sputter the platinum and nickel than it is aluminum.

Because of the characteristics of the platinel silicide, it will operate very effectively with either gold or aluminum bonding systems.

It has been found that when the platinel is reacted with silicon having a <100> orientation with respect to the surface plane of the silicon semiconductor body, the resultant alloy is inert to sodium hydroxide and potassium hydroxide so that the platinel silicide can be utilized as a very effective anisotropic etch mask. Anisotropic etchants such as potassium hydroxide are utilized in conjunction with certain buffers or sodium hydroxide itself to etch the silicon.

In conjunction with the foregoing, the principal purpose was to provide a platinel silicide which would make it possible to obtain the same barrier height as could be obtained with a conventional aluminum system which is 0.70 electron volts in <111> silicon. It now has been found that this 0.70 electron volt figure may not be optimum for the best possible electronic design for integrated circuits. In order to achieve the optimum electronic design for an integrated circuit, it has been found that it is particularly desirable to be able to adjust the barrier height between 0.64 and 0.835 electron volts. In the platinel silicide system, it has been found that an optimized barrier height is 0.75 electron volts which is particularly advantageous in the design of certain integrated circuits.

In carrying out this work, a graph was developed as shown in FIG. 10 which shows the relationship of platinel silicide Schottky barrier height as a function of the platinum concentration for a guard ring diode with $V_f$ measured at 10μA in <111> oriented silicon. As can be seen from FIG. 10, a 100% nickel silicide has a barrier height of 0.65 electron volts which is at the left-hand side of the graph in FIG. 10. By adding platinum to the composition, it can be seen that the barrier height increases until it reaches 0.835 electron volts at 100% platinum. The curve in the graph shows that there is a very rapid change as platinum is added to the composition of the range from zero to 10% platinum and that from 10% platinum to 100% platinum, there is approximately a straight line relationship. From the graph, it can be seen that by utilization of the present invention, a selected barrier height can be chosen ranging from 0.64 to 0.835 electron volts depending upon the composition.

This is a very important feature because it makes it possible for the circuit designer to optimize the geometrical requirements and the electrical requirements of the integrated circuit and then tailoring the barrier height to fit these requirements. Since this is possible, it is possible to reduce the size of the clamping device very significantly as, for example, by a factor of 2 or 3, by virtue of the lowering of the barrier height while still maintaining a usable series resistance.

Although the disclosure herein is primarily directed to the use of nickel and platinum, it should be appreciated that any two metals can be utilized which will combine with silicon to make it possible to adjust the barrier height. In addition, it should be appreciated that it should be possible to utilize more than two metals as, for example, 3 or 4 metals to obtain similar features.

It is apparent from the foregoing that there has been provided a new and improved semiconductor structure in which platinel silicide is utilized as a Schottky barrier diode and method for making the same in which optimum Schottky barrier heights are obtained with good contact resistance. With the method, it is possible to obtain very high yield even in complicated circuits. In addition, it is possible to adjust the barrier height between 0.64 and 0.835 electron volts to permit a circuit designer to optimize the electrical and geometrical requirements of the circuit and then tailoring the barrier height to meet these requirements.

I claim:

1. In a method for fabricating a Schottky barrier diode semiconductor structure, providing a semiconductor body formed essentially of silicon having a surface, forming an active semiconductor device in said semiconductor body having collector, base and emitter regions extending to said surface, forming an insulative coating on said surface with openings exposing portions of said regions, one of said openings extending from the base region to the collector region, forming a ternary alloy of approximately 50% silicon, 37½% to 45% nickel and 5% to 12½% platinum in said openings in ohmic contact with the emitter, base and collector regions and in rectifying contact with the collector region in said one opening, whereby a Schottky barrier diode is formed in said one opening, and adjusting the relative amounts of nickel and platinum in said alloy to provide a predetermined barrier height in the range of approximately 0.64 to 0.835 electron volts.

2. A method as in claim 1 wherein the relative amounts of nickel and platinum are adjusted so that the ternary alloy contains 37½% nickel and 12½% platinum to provide a barrier height of approximately 0.75 electron volts.

3. A method as in claim 1 wherein the formation of said ternary alloy is by use of a solid-solid reaction.

4. A method as in claim 3 wherein said solid-solid reaction is carried out ranging in temperatures from 350° to approximately 900°C.

5. A method as in claim 3 wherein said solid-solid reaction is carried out in a temperature of approximately 450°C.

6. In a method for fabricating a Schottky barrier diode semiconductor structure, the steps of: providing a semiconductor body formed essentially of silicon having a surface, forming an active semiconductor device in said semiconductor body having emitter, base and collector regions extending to said surface, forming a coating on such surface comprised of at least two metals including nickel and platinum which combine with the silicon to form at least a ternary alloy which is in ohmic contact with the emitter, base and collector regions and is also in rectifying contact with the collector region to form a Schottky barrier diode, and adjusting the ratio of nickel and platinum so that the platinum forms 25% and the nickel 75% of the two-metal coating to provide a barrier height of approximately 0.75 electron volts.

* * * * *